United States Patent
Ouyang et al.

(10) Patent No.: US 8,009,461 B2
(45) Date of Patent: Aug. 30, 2011

(54) SRAM DEVICE, AND SRAM DEVICE DESIGN STRUCTURE, WITH ADAPTABLE ACCESS TRANSISTORS

(75) Inventors: Xu Ouyang, Hopewell Junction, NY (US); Louis C. Hsu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 179 days.

(21) Appl. No.: 11/969,981

(22) Filed: Jan. 7, 2008

(65) Prior Publication Data
US 2009/0175068 A1  Jul. 9, 2009

(51) Int. Cl.
*G11C 11/00* (2006.01)
(52) U.S. Cl. ............. 365/154; 365/188; 365/189.11
(58) Field of Classification Search ............. 365/188, 365/189.11, 154
See application file for complete search history.

(56) References Cited

U.S. PATENT DOCUMENTS

| | | | |
|---|---|---|---|
| 5,982,211 A | 11/1999 | Ko | |
| 6,087,886 A | 7/2000 | Ko | |
| 6,181,608 B1 | 1/2001 | Keshavarzi et al. | |
| 6,363,006 B2* | 3/2002 | Naffziger et al. | 365/154 |
| 6,573,549 B1 | 6/2003 | Deng et al. | |
| 6,614,696 B2* | 9/2003 | Kanno et al. | 365/187 |
| 6,784,028 B2 | 8/2004 | Rueckes et al. | |
| 6,835,591 B2 | 12/2004 | Rueckes et al. | |
| 6,836,424 B2 | 12/2004 | Segal et al. | |
| 6,849,492 B2 | 2/2005 | Helm et al. | |
| 6,911,682 B2 | 6/2005 | Rueckes et al. | |
| 6,919,592 B2 | 7/2005 | Segal et al. | |
| 6,920,061 B2 | 7/2005 | Bhavnagarwala et al. | |
| 6,942,921 B2 | 9/2005 | Rueckes et al. | |
| 6,979,590 B2 | 12/2005 | Rueckes et al. | |
| 7,056,758 B2 | 6/2006 | Segal et al. | |
| 7,120,047 B2 | 10/2006 | Segal et al. | |
| 7,123,529 B1 | 10/2006 | Hanson et al. | |
| 7,170,809 B2 | 1/2007 | Joshi | |
| 7,176,505 B2 | 2/2007 | Rueckes et al. | |
| 7,177,176 B2* | 2/2007 | Zheng et al. | 365/154 |
| 7,189,607 B2 | 3/2007 | Helm et al. | |
| 7,217,978 B2 | 5/2007 | Joshi et al. | |
| 7,242,239 B2 | 7/2007 | Hanson et al. | |
| 7,295,458 B2 | 11/2007 | Chan et al. | |
| 7,453,716 B2* | 11/2008 | Kim et al. | 365/148 |
| 7,471,544 B2* | 12/2008 | Nakazato et al. | 365/154 |
| 2006/0273393 A1 | 12/2006 | Chidambarrao et al. | |
| 2006/0281236 A1 | 12/2006 | Datta et al. | |

* cited by examiner

*Primary Examiner* — Son T Dinh
*Assistant Examiner* — Nam T Nguyen
(74) *Attorney, Agent, or Firm* — Scully, Scott, Murphy & Presser, P.C.; Joseph P. Abate, Esq.

(57) ABSTRACT

A semiconductor device includes a SRAM having a pair of MCSFETs connected as access transistors (pass gates). A design structure embodied or stored in a machine readable medium includes a SRAM having two MCSFETs connected as access transistors.

9 Claims, 5 Drawing Sheets

$Vt1 < read\_WL < Vt2 < write\_WL$

SRAM DEVICE, AND SRAM DEVICE DESIGN STRUCTURE, WITH ADAPTABLE ACCESS TRANSISTORS

BACKGROUND OF THE INVENTION

The present invention generally relates to semiconductor memory devices and, more particularly, to Static Random Access Memory (SRAM) devices and to design structures for SRAM devices.

Referring to FIGS. 1A and B, in the known 6 transistor (6T) SRAM cell that is widely used in the industry today, read and write operations have different requirements for the access transistors (pass gates N3,N4). During the read operation, a pull-down transistor (e.g., N1) is fighting with the access transistor (e.g., N3) to pull a bitline BL voltage level down. Therefore, a strength of the access transistor N3 should be less than that of the pull-down transistor N1. During the write operation, the access transistor (e.g., N3) is fighting with a pull-up transistor P1 to pull the internal node down. Therefore, a strength of the access transistor N3 should be more than that of the pull up transistor P1. To satisfy requirements of both read and write operations, the access transistor N3 strength must be suitably between those of the pull-up and the pull-down transistors P1,N1. The same rationale applies to access transistor N4 and pull up and pull down transistors P2,N2. However, as the IC scaling continues to progress, it becomes increasingly challenging to control the variations in SRAM circuits. Thus, it is increasingly difficult to control access transistor strength to be suitably between those of the pull-up and the pull-down transistors. Various 6T and other SRAM devices, their methods of operation and process for their manufacture are described, for example, in U.S. Pat. No. 6,920,061, LOADLESS NMOS FOUR TRANSISTOR DYNAMIC DUAL VT SRAM CELL, filed Aug. 27, 2003, to Bhavnagarwala et al.; U.S. Pat. No. 7,217,978, SRAM MEMORIES AND MICROPROCESSORS HAVING LOGIC PORTIONS IMPLEMENTED IN HIGH-PERFORMANCE SILICON SUBSTRATES AND SRAM ARRAY PORTIONS HAVING FIELD EFFECT TRANSISTORS WITH LINKED BODIES AND METHOD FOR MAKING SAME, filed Jan. 19, 2005, to Joshi et al.; U.S. Pat. No. 7,295,458, EIGHT TRANSISTOR SRAM CELL WITH IMPROVED STABILITY REQUIRING ONLY ONE WORD LINE, filed Jan. 18, 2006, to Chan et al.; and U.S. Pat. No. 7,170,809, STABLE MEMORY WITH HIGH MOBILITY CELL DEVICES, filed May 13, 2005, to Joshi, which are all hereby incorporated in their entireties by reference.

Various techniques have been proposed in the prior art to address the difficult challenge. See for instance, in "2005 *Symposium on VLSI Technology Digest of Technical Papers*", page 128-129, the paper titled "Stable SRAM Cell Design for the 32 nm Node and Beyond" which describes an 8-transistor SRAM cell to address the problem mentioned above. However, the 8-transistor SRAM design requires additional transistors, word-lines, and bit-lines, and therefore seems significantly to increase the area of the SRAM and to add process complexity.

Another example is U.S. Pat. No. 4,953,127 to Nagahashi et al. which describes a semiconductor memory having different read and write word line voltage levels. However, the choice of word line voltage levels is limited by device reliability and various other circuit and technology concerns. Therefore, its advantage seems to be limited.

Further, multiple conduction state field effect transistors (MCSFETs) are known. See, for example, U.S. Patent Application Publication No. 2006/0273393 to Chidambarrao et al., STRUCTURE AND METHOD OF MAKING FIELD EFFECT TRANSISTOR HAVING MULTIPLE CONDUCTION STATES, filed Jun. 7, 2005.

See also U.S. Pat. No. 7,123,529 to Hanson et al. U.S. Pat. No. 7,242,239 to Hanson et al. The '393 Publication, and the '529 and '239 patents are all hereby incorporated in their entireties by reference.

The multiple-conduction state FET ("MCSFET") is similar to known FETs in that it has an essentially nonconductive state when a gate to source voltage applied to the MCSFET does not exceed a first threshold voltage. The MCSFET also has a fully conductive state when the gate to source voltage is above a second threshold voltage or "final threshold voltage" that enables the MCSFET to be fully conductive. The fully conductive state is defined as a level in which an inversion layer forms in the channel region as a result of the voltage applied between the gate and the source of the MCSFET.

However, unlike ordinary FETs, the first threshold voltage and the final threshold voltage have different values. When the gate to source voltage is between the first threshold voltage and the final threshold voltage the MCSFET has another conductive state in which the MCSFET is turned on, but conducts a relatively low amount of current. At that time, the MCSFET conducts a current having a magnitude which is ten or more times smaller than the current conducted when the MCSFET exceeds the final threshold voltage level. Here, when the gate to source voltage is at such level, the MCSFET is turned on, in that an inversion layer forms in a part of the channel region as a result of the voltage applied between the gate and the source of the MCSFET. The difference is that when the gate to source voltage is above the final threshold voltage and the MCSFET is in the second conductive state, the inversion layer of the MCSFET extends within a larger part of the channel region so as to turn on a larger part of the transistor. Thus, a predetermined part of the MCSFET smaller than the entire MCSFET becomes fully conductive when the gate-source voltage exceeds the first threshold voltage, and a remaining predetermined part of the MCSFET becomes fully conductive when the gate-source voltage exceeds the second or "final" threshold voltage level. In particular known embodiments, the MCSFET is fabricated in such way that the transistor has one threshold voltage for a first part of the width of the transistor channel, and has a higher threshold voltage for the remaining part of the transistor channel width. For example, the transistor can have a gate oxide that varies in thickness between the two parts of the transistor channel width and conditions in which threshold voltage implants are conducted in the two parts of the transistor channel can be varied in order to achieve the desired difference in threshold voltages.

SUMMARY OF THE INVENTION

The present inventors believe that improvements in SRAMs can be achieved if, for example, an SRAM is combined with the benefits of MCSFETs.

According to a preferred embodiment of the present invention, an SRAM device includes a pair of MCSFETs connected as the pass gates (access transistors).

OBJECTS OF THE INVENTION

Accordingly, it is an object of the invention to provide a SRAM with adaptable access transistors, where the strength of the access transistors can be adaptively changed during read and write operations to improve read and write margins.

It is a further object to provide an SRAM device having a dual-Vt device structure.

It is still a further object of the present invention to provide an SRAM device design structure having area characteristics which are desirable.

BRIEF DESCRIPTION OF THE DRAWINGS

The accompanying drawings, which are incorporated in and which constitute part of this application, illustrate the presently preferred embodiments of the invention which, together with the general description given above and the detailed description of the preferred embodiments given below serve to explain the present invention.

DETAILED DESCRIPTION

Figure 2:
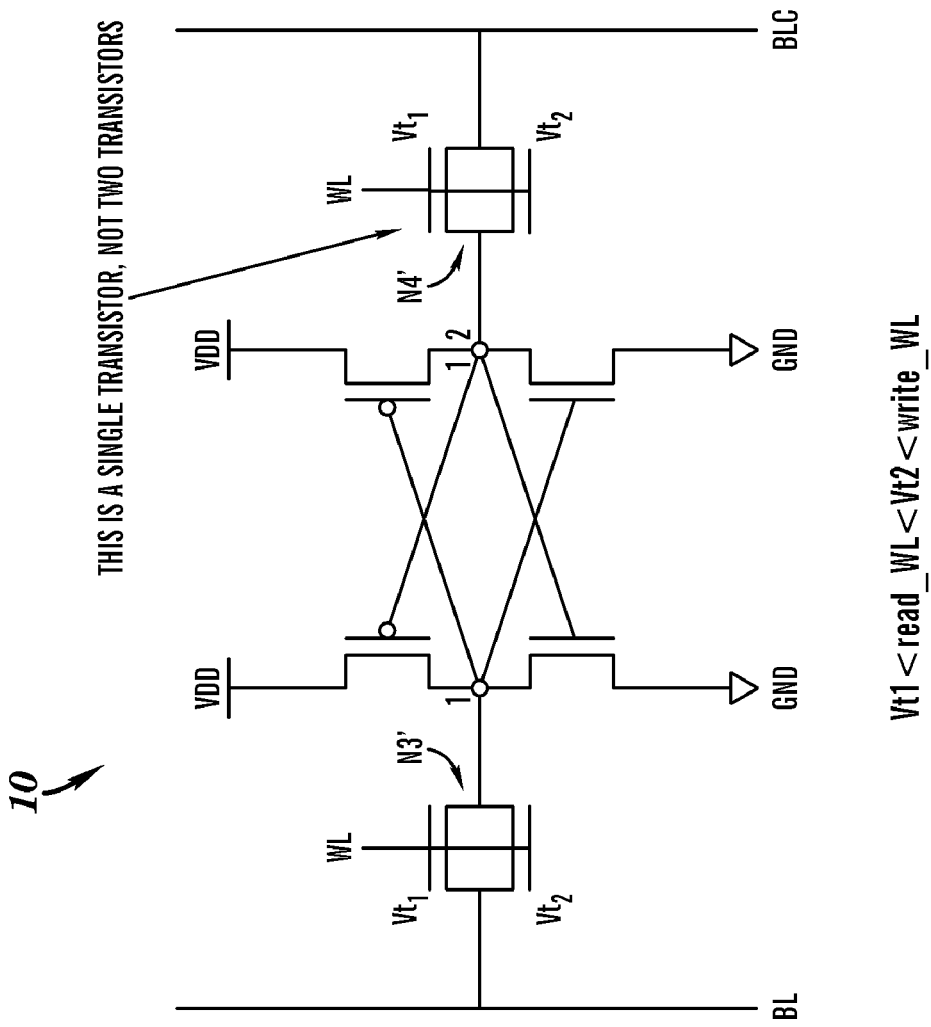
FIG. 2 is a schematic circuit diagram of an SRAM device according to a preferred embodiment of the present invention with adaptable access transistors (i.e., MCSFETs).

Hereinafter will be described the details of one or more preferred embodiments of the present invention.
SRAM Device with MCSFETs as Access Transistors:

Referring now to FIG. 2, a 6T SRAM device 10 includes a pair of MCSFETs N3' and N4' connected as access transistors. Of course, as is understood by those skilled in the art, the SRAM device 10 per se may exclude voltage sources for generating the biasing voltages VDD and signal and line voltages BL, BLC, WL. Each access transistor N3',N4' has dual Vt's (Vt1,Vt2) in this SRAM cell (device): half of the transistor 10 can be turned on at Vt1, while the other half can be turned on at Vt2. The SRAM 10 is fabricated by any known MCSFET and MOSFET fabrication processes, which need not be further discussed. For such fabrication processes, see, for example, the text *VLSI Technology* by S. M. Sze, second edition (McGraw Hill Pub. Company, 1988, TK7874.V566 1988, ISBN 0-07-062735-5). For several various known MCSFETs and applications, see the patent publication and patents previously incorporated by reference.

Figures 1A, 1B:
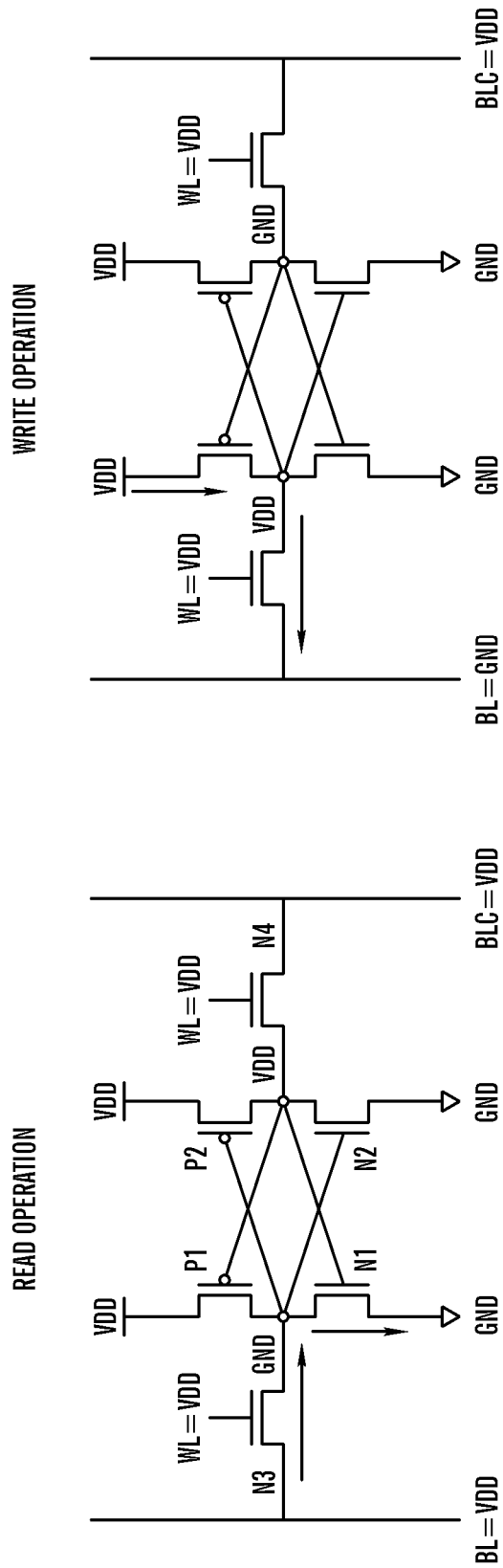
FIGS. 1A and B are schematic circuit diagrams of a conventional 6-transistor (6T) SRAM device.

During a read operation as shown in FIG. 2, a wordline (WL) voltage is set to a level between Vt1 and Vt2, and then only partial of the transistor (e.g., N3') with Vt1 is turned on—which makes the transistor weak. During a write operation, a wordline voltage (WL) is set to a level which is higher than Vt2. Therefore, the entire transistor (e.g., N3') is turned on which makes the transistor N3' strong with a large drivability. Because the strength of access transistors N3',N4' can be adaptively changed by the applied wordline voltage depending on read or write operations, the soft failures related to both read and write operations are believed significantly reduced. Also, because each of the access transistors is still a "single" transistor, although each has dual threshold voltages Vt1,Vt2, the transistors N3',N4' do not occupy significant additional area compared with regular (e.g., non-MCSFETs) access transistors. In the present inventors' opinions, this is a significant advantage compared with the known 6-transistor SRAM as shown in FIGS. 1A and 1B.

Figure 3:
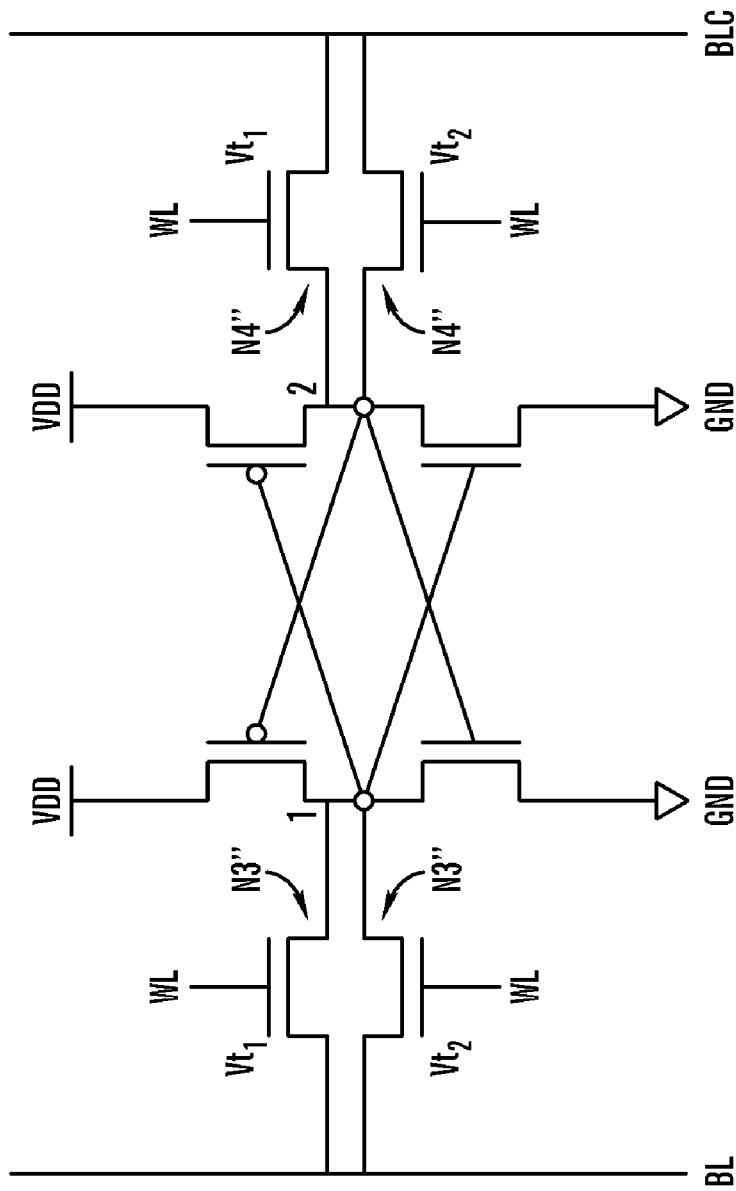
FIG. 3 is another embodiment of the present invention, where each adaptable access transistor is replaced by a pair of regular access transistors with different threshold voltages.

FIG. 3 shows an alternative embodiment without MCS-FETs. Here, each dual-Vt access transistor is replaced by two separate regular access transistors N3",N4" connected in parallel, each having a different Vt (voltage threshold) as shown. This SRAM design has the same advantage of reducing soft failures during read and write operations as the SRAM design in FIG. 2, and it can be fabricated without any additional material process steps because the access transistors here are purely regular (MOSFET) transistors. However, in the embodiment of FIG. 3, the SRAM cell size is slightly larger than that of a conventional 6-transistor SRAM because it has 8 transistors. However, its size is still smaller than that of a conventional 8-transistor SRAM proposed, for example, by Chang et al. (discussed in the background section) because no additional word-lines or bit-lines are needed.

Figure 4:
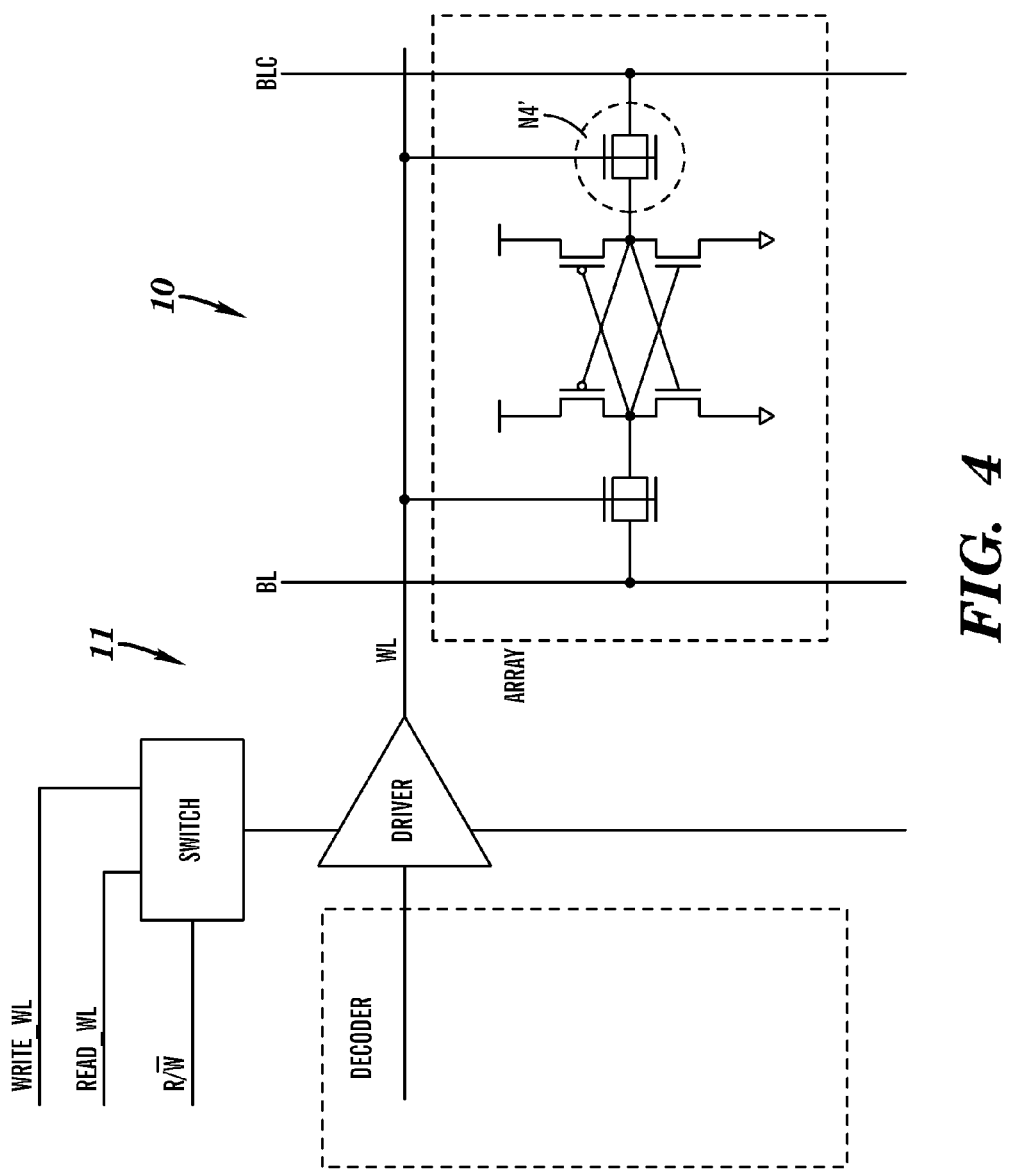
FIG. 4 is a schematic circuit diagram of wordline control circuit connected to the SRAM having MCSFETs N4' where a wordline voltage (WL) can be adaptively changed during the read and write operations.

A circuit design of a word-line voltage control circuit to provide two voltages during read and write cycles (operations) is shown in FIG. 4. FIG. 4 shows a schematic circuit diagram illustrating one preferred implementation of the word line voltage control circuit 11 connected to the SRAM device (cell) 10 having MCFETs N4'. A switch block is used to select either a Write-WL voltage during a write operation or a Read-WL voltage during a read operation. The corresponding voltage level is fed to the word-line (or WL) via a word-line driver. A decoder is connected as shown. The various elements of the circuit 11 can be readily realized by those skilled in the art with suitable conventional components tailored to suit the SRAM cell 10. Other designs and implementations have also been described in various technical literatures.

In one preferred embodiment of the present invention which can be fabricated for a 45 nm technology node, Vt1 is approximately (±10%) 0.35V, Vt2 is approximately 0.8V, and VDD is, for example, approximately 1 volt.

Figure 5:
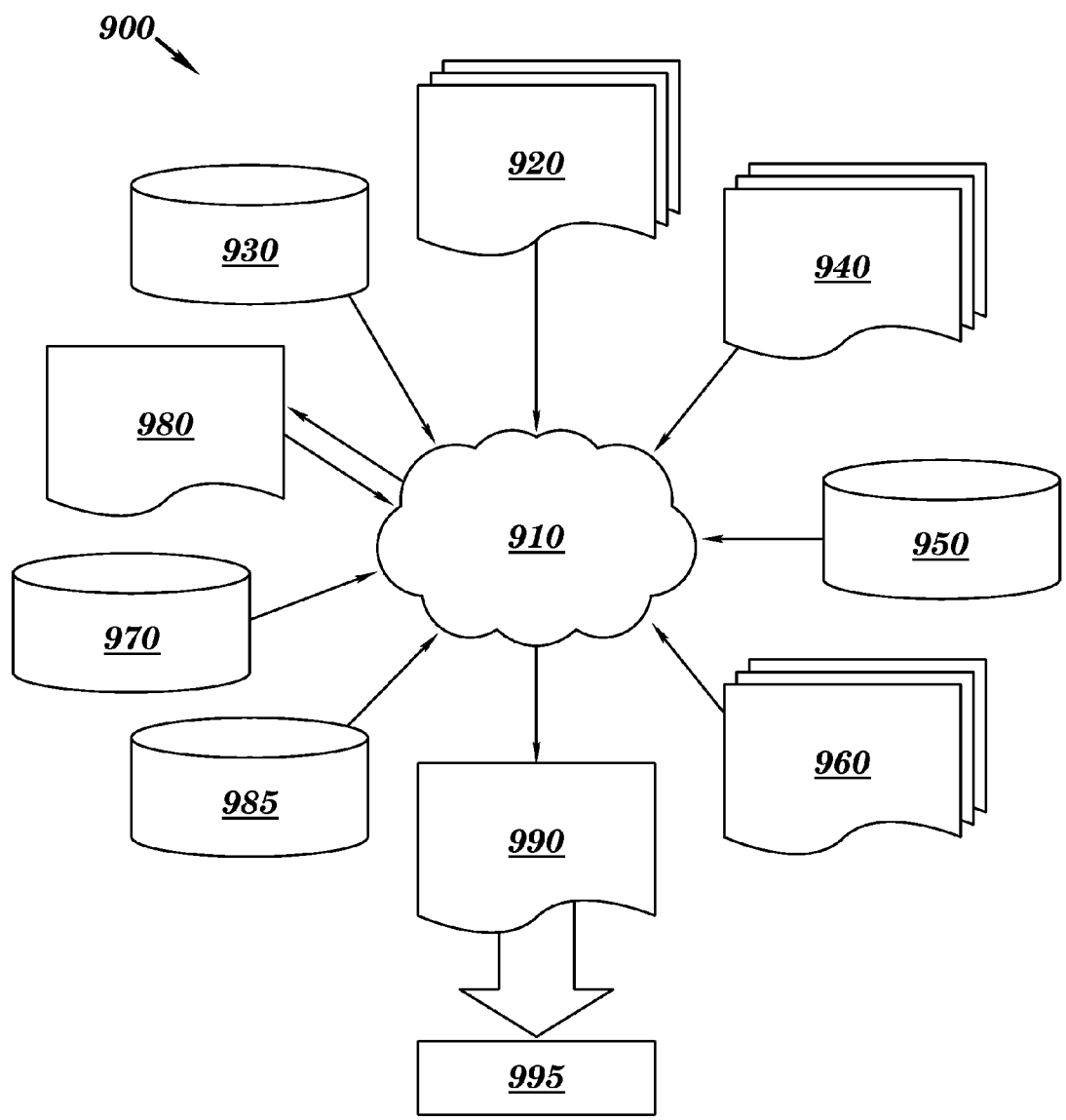
FIG. 5 is a flow diagram of a design process useable in semiconductor device design, manufacture and/or test.

FIG. 5 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIG. 2 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIG. 2. Design process 910 preferably synthesizes (or translates) an embodiment of the invention as shown in FIG. 2 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIG. 2, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 2. Design structure 990 may then proceed to a stage 995 where, for example, design structure 990: proceeds to tape-out, is released to manufacturing, is released to a mask house, is sent to another design house, is sent back to the customer, etc.

While the present invention has been particularly described in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A semiconductor device comprising an SRAM including a pair of MCSFETs connected as access transistors, each of the access transistors is electrically connected to a wordline control circuit including a single wordline conductor connected to a gate of each said MCSFET of said pair for controlling said MCSFET access transistor, said wordline control circuit including a switch device for driving a respective gate of each said MCSFET via said single wordline conductor at a voltage between a first threshold voltage Vt1 and a second threshold voltage Vt2 for a read operation of said SRAM, and, said switch device for driving a respective gate of each said MCSFET via said single wordline conductor at a voltage greater than Vt2 for a write operation.

2. The semiconductor device as claimed in claim 1, wherein each access transistor has a Vt1 of approximately 0.35 volts.

3. The semiconductor device as claimed in claim 2, wherein each access transistor has a Vt2 of approximately 0.8 volts.

4. A design structure tangibly embodied in a machine readable medium for designing, manufacturing, or testing an integrated circuit, the design structure comprising a SRAM device design including a pair of MCSFETs connected as access transistors, each of the access transistors is electrically connected to a wordline control circuit including a single wordline conductor connected to a gate of each said MCSFET of said pair for controlling said MCSFET access transistor, said wordline control circuit including a switch device for driving a respective gate of each said MCSFET via said single wordline conductor at a voltage between a first threshold voltage Vt1 and a second threshold voltage Vt2 for a read operation of said SRAM, and, said switch device for driving a respective gate of each said MCSFET via said single wordline conductor at a voltage greater than Vt2 for a write operation.

5. The design structure as claimed in claim 4, wherein each pass gate has a threshold voltage (Vt1) of approximately 0.35 volts.

6. The design structure as claimed in claim 5, wherein each pass gate has a threshold voltage (Vt2) of approximately 0.8 volts.

7. The semiconductor device as claimed in claim 4, wherein the SRAM device is a 6T device.

8. The design structure as claimed in claim 4, wherein the SRAM device is a 6T device.

9. The semiconductor device as claimed in claim 4, wherein the semiconductor device is fabricated for a 45 nm technology node.

* * * * *